(12) United States Patent
Ng et al.

(10) Patent No.: US 7,404,652 B2
(45) Date of Patent: Jul. 29, 2008

(54) LIGHT-EMITTING DIODE FLASH MODULE WITH ENHANCED SPECTRAL EMISSION

(75) Inventors: Kee Yean Ng, Penang (MY); Heng Yow Cheng, Penang (MY); Yew Cheong Kuan, Penang (MY)

(73) Assignee: Avago Technologies ECBU IP Pte Ltd, Singapore (SG)

( * ) Notice: Subject to any disclaimer, the term of this patent is extended or adjusted under 35 U.S.C. 154(b) by 0 days.

(21) Appl. No.: 11/012,761

(22) Filed: Dec. 15, 2004

(65) Prior Publication Data

US 2006/0126326 A1 Jun. 15, 2006

(51) Int. Cl.
*F21V 9/16* (2006.01)
(52) U.S. Cl. .......................... 362/231; 362/84; 362/800
(58) Field of Classification Search ................. 362/231, 362/84, 227, 230, 293, 555, 545, 800; 257/88–89, 257/100, 787
See application file for complete search history.

(56) References Cited

U.S. PATENT DOCUMENTS

| 7,005,667 | B2 * | 2/2006 | Chen et al. ..................... 257/14 |
| 7,005,679 | B2 * | 2/2006 | Tarsa et al. .................... 257/89 |
| 7,083,302 | B2 * | 8/2006 | Chen et al. ................... 362/231 |
| 7,206,507 | B2 * | 4/2007 | Lee et al. ....................... 257/98 |
| 2004/0217364 | A1 | 11/2004 | Tarsa et al. |
| 2006/0071329 | A1 * | 4/2006 | Du .............................. 257/100 |

FOREIGN PATENT DOCUMENTS

| DE | 102004052245 A1 | 2/2006 |
| WO | WO2005/022030 A2 | 3/2005 |

\* cited by examiner

*Primary Examiner*—Y M. Lee

(57) ABSTRACT

A light-emitting diode ("LED") device includes a plurality of LEDs. Each LED in the plurality of LEDs is adjacent to at least one other of the plurality of LEDs. At least one of the plurality of LEDs has a radiation with a full-width-half-maximum greater than 50 nm.

17 Claims, 5 Drawing Sheets

LIGHT-EMITTING DIODE FLASH MODULE WITH ENHANCED SPECTRAL EMISSION

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

The invention relates to light-emitting diode ("LED") devices, and more particularly to LED devices having a plurality of LEDs arranged in an array for use in flash applications.

An LED is a semiconductor device capable of emitting light when an electric current flows through it. LEDs are used in many applications, such as electronic displays, traffic signals, and video signs. LEDs emit monochromatic light, i.e., the wavelength of light emitted by an LED falls within a narrow range, typically about 20-50 nanometers ("nm"). However, different types of LEDs emit different wavelengths (colors) of light. LEDs are often characterized by the full-wave-half-maximum ("FWHM"), which is the spread of wavelength emitted by an LED at 50% of maximum radiation power.

FIG. 1 is a plot of a typical spectral emission of an LED illustrating the LED's FWHM. The output is shown in arbitrary units of light radiation, and the FWHM is the difference between $\lambda_1$ and $\lambda_2$.

LEDs are also used in appliances such as mobile phones, personal digital assistants ("PDAs"), and digital cameras. LEDs are used in mobile camera phones in the flash module. In this application, an LED module acts as an illumination source and is activated when a picture is taken when there is insufficient ambient light, or when back-fill lighting is desired. At least three LEDs are typically used in a flash module, a red LED (i.e., an LED emitting red light), a green LED, and a blue LED.

FIG. 2 shows three plots of three LEDs in arbitrary units versus wavelength. A first plot 20 shows the output from a blue LED, a second plot 22 shows the output from a green LED, and a third plot 24 shows the output from a red LED. The combined spectral emission of these three LEDs is not ideal because it is peaky and discontinuous. A gap 23 occurs between the second plot 22 and the third plot 24. Peaky, discontinuous spectral emission from a flash module can result in poor image quality, such as unfaithful reproduction of the color of the subject. Hence, an LED flash module providing better color image quality is desirable.

BRIEF SUMMARY OF THE INVENTION

A light-emitting diode ("LED") device includes a plurality of LEDs. Each LED in the plurality of LEDs is adjacent to at least one other of the plurality of LEDs. At least one of the plurality of LEDs has a radiation with a full-width-half-maximum greater than 50 nm.

DETAILED DESCRIPTION OF THE EMBODIMENTS

I. Introduction

Figure 1:
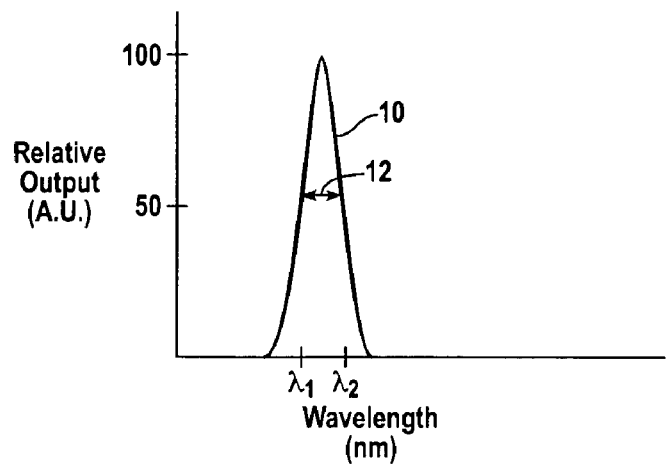
FIG. 1 is a plot of a typical spectral emission of an LED illustrating the LED's FWHM.
Figure 2:
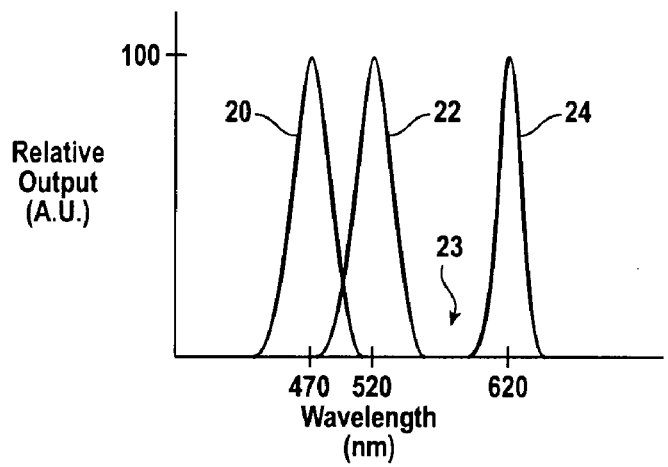
FIG. 2 shows three plots of three LEDs in arbitrary units versus wavelength.

Prior art flash modules tend to be peaky and discontinuous. The dips between spectral peaks can result in poor color fidelity. In particular, a combined spectral emission such as the one shown in FIG. 2 is missing spectral emission in the greenish-yellow region. A combined spectral emission lacking in light in this region will not be able to faithfully reproduce a good color image of the subject. This problem is particularly bad if the spectral reflectivity of the subject lies primarily where the spectral emission of the flash module is weak or missing.

The spectral emission of a flash module can be improved by using LEDs that have large FWHMs, such as greater than 50 nm. In one embodiment, at least one of a red LED, a green LED, and a blue LED has an FWHM greater than 50 nm. In a further embodiment, at least two of a red LED, a green LED, and a blue LED have FWHMs greater than 50 nm. In a yet further embodiment, each of a red LED, a green LED, and a blue LED in a flash module has a FWHM greater than 50 nm. In an alternative embodiment, at least one LED in a flash module is not a red, green, or blue LED.

The spectral emission of a flash module can also be improved by using phosphor-converted LEDs. A phosphor-converted LED has a layer of wavelength-converting material over an LED chip. The wavelength-converting material absorbs light at one wavelength, and emits light at another (usually longer) wavelength, and is commonly referred to as a "phosphor" material. In a particular embodiment, one or more of the LEDs used in a flash module having phosphor-converted LEDs has a FWHM greater than 50 nm. The radiation of the LED chip, which is called the first radiation, is used to excite the wavelength-converting material, which then emits radiation of a different wavelength(s), called the second radiation. The second radiation is then combined with a portion of the unconverted first radiation, if any, to yield a composite radiation. The second radiation emitted by the wavelength-converting material is usually very broad compared to first radiation emitted by the LED chip. The second radiation typically has an FWHM greater than 50 nm.

In some embodiments, a flash module is made from an array of LED chips having essentially the same spectral output, and different wavelength-converting material is used on the LED chips to produce a wide composite radiation to provide LEDs emitting different colors. For example, a flash module with three blue LED chips has a green wavelength-converting material (i.e., the wavelength-converting material is stimulated by the blue light from the LED and emits green light) on a first blue LED chip, a red wavelength-converting material on a second blue LED chip, and no wavelength-converting material on a third blue LED chip. The green-converted (first) LED emits green second radiation and unconverted blue first radiation. The red-converted (second) LED emits red second radiation and unconverted blue first radiation, and the third LED emits blue first radiation. As used herein, when describing an LED as emitting a color (i.e. "colored LED", as opposed to a white-emitting LED, for example), it means that the colored LED emits a range of wavelengths that would be perceived by an observer as having a characteristic color, such as red, yellow, green, or blue.

Using differently colored LEDs in a flash module allows adjustment of the color temperature of light emitted by the flash module. For example, if a lower color temperature is desired from the flash module, relatively more power is supplied to a red LED, compared to a blue LED. This results in a "warmer" tone (even though it results in a lower color temperature) and is particularly desirable when photographing human models. Similarly, different types of photographic film and photo detector arrays have different color responses. A flash module with individually colored LEDs allows tuning the color output by the flash modules for different applications. Flash modules using a conventional flash discharge tube or white-emitting LEDs do not allow such color tuning.

Figure 3A:
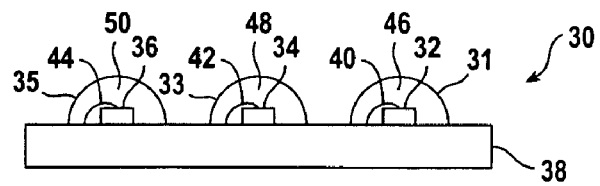
FIG. 3A is a simplified side view of an LED device having three LED chips mounted on a substrate according to an embodiment of the invention.

FIG. 3A is a simplified side view of an LED device 30 having three LED chips 32, 34, 36 mounted on a substrate 38 according to an embodiment of the invention. Each LED chip is a blue-emitting LED chip. The blue-emitting LED chips have a peak wavelength preferably less than about 500 nm. Alternatively, the LED chips have peak wavelengths between about 250 nm and about 500 nm. The first radiation of the LED chip is chosen in light of the phosphor intended to be used, to insure that the phosphor is activated (excited) by the first radiation. That is to say, the green phosphor is activated by the blue light (e.g. at about 480 nm) from the blue-emitting LED chip and then emits in the desired green color. Using a UV LED with this green phosphor will not work if the green phosphor is not activated by UV light. In that case, a different green-emitting phosphor is used with a UV LED. For purposes of discussion, blue light has wavelengths between about 450 nm and about 480 nm, green has wavelengths between about 500 nm and about 530 nm, and red light has wavelengths between about 600 nm and about 660 nm LEDs with peak wavelengths less than about 400 nm emit in the ultraviolet region of the electromagnetic spectrum and are known as UV LEDs.

The LED chips are mounted on the substrate 38 using standard die-attach techniques. Alternatively, two or more of the LED chips are integrated on a single submount. Wire bonds 40, 42, 44 electrically connect the tops of the LED chips 32, 34, 36 to metal traces (not shown) on the substrate. The first LED chip 32 is a blue LED chip covered with an encapsulant 46 containing a green wavelength-converting material, such as europium-doped strontium thiogallate ($SrGa_2S_4$:Eu). A second LED chip 34 is a blue LED chip covered with an encapsulant 48 containing a red wavelength-converting material, such as europium-doped strontium sulphide (SrS:Eu). A third LED chip 36 is covered with an encapsulent 50 that does not contain a wavelength-converting material.

A practical method of putting wavelength-converting material in encapsulant is to premix particles of the wavelength-converting material into a liquid encapsulant base, such as a polymer epoxy or silicone encapsulant base, and dispensing the mixture onto or over the LED. Alternatively, particles of wavelength-converting material are premixed into mold pallets with solid or plastic encapsulant base, and then molded over the LED. In a particular embodiment, an encapsulant base is a glass that is mixed with wavelength-converting material and then fused over the LED.

Figure 3B:
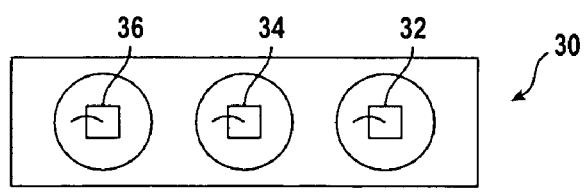
FIG. 3B is a plan view of the LED device of FIG. 3A.

FIG. 3B is a plan view of the LED device 30 of FIG. 3A. The LED chips 32, 34, 36 are aligned, but may be arranged in a triangular, circular, or other fashion. It is generally desirable that the each LED chip in the LED device be adjacent to another, so that the light output from the LED device appears essentially as the sum of the LED chips, and not as discrete colored light sources.

Figure 3C:
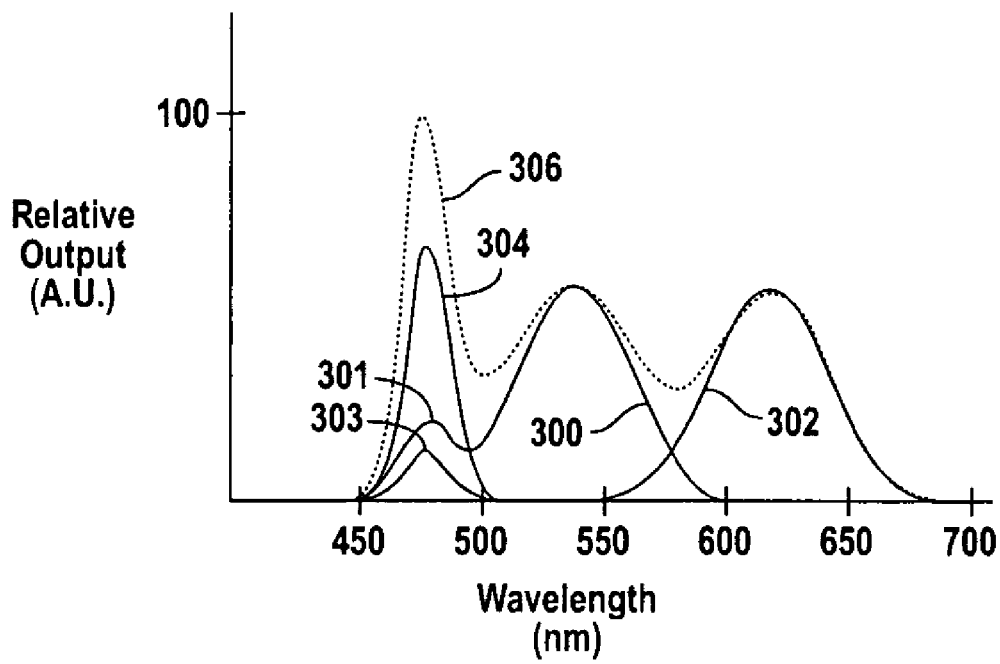
FIG. 3C shows three plots of the LEDs in an LED device according to FIGS. 3A and 3B.

FIG. 3C shows three plots 300, 302, 304 of the LEDs in an LED device according to FIG. 3A. The first plot 300 shows the composite spectral output of the first LED, which is a blue LED chip with a green wavelength-conversion encapsulant material. The second plot 302 shows the composite spectral output of the second LED, which is a blue LED chip with red wavelength-conversion encapsulant material, and the third plot 304 shows the spectral output of the third LED, which is a blue LED chip with no wavelength conversion. A fourth plot 306, shown as a dashed line, shows the combined spectral output from the three LEDs, i.e. the sum of the individual plots 300, 302, 304. A broad spectral emission is obtained, in other words, the total combined emissions are gap-free from about 450 nm to about 650 nm, with peaks in the blue, green, and red regions. Light that appears substantially white (i.e. plot 306) is obtained by combining the emissions of the red, blue, and green emissions of the three LEDs in the appropriate proportions. In this embodiment, the composite radiation of the first and second LEDs contains unconverted (first) blue emissions 301, 303.

In an alternative embodiment, two blue LED chips are used, one with a green wavelength-converting material and the other with a red wavelength-converting material. The unconverted blue light from the red and green LEDs avoids the need for a separate blue LED. The amount of phosphor loading on one or both of the remaining LEDs is selected to provide a desired amount of unconverted blue light to contribute to the combined spectral output.

The proportion of the first and second radiation of a converted LED can be controlled by the loading of the wavelength-converting material. When loading is low, the proportion of the first radiation is higher than the second radiation. The proportion of second radiation increases with increased loading. When loading is high, the proportion of the second radiation is higher than the first radiation. Loading can be increased such that only the second radiation is obtained, i.e., essentially all of the first radiation is absorbed and converted by the wavelength-converting material.

Referring to FIG. 3A, a first LED 31 includes a first blue LED chip 32 covered with encapsulant 46 containing sufficient green wavelength-converting material so that essentially no first blue light is emitted to form a green LED. A second LED 33 includes a second blue LED chip 34 covered with encapsulant 48 containing sufficient red wavelength-converting material so that essentially no first blue light is emitted to form a red LED. A third LED 35 includes a third blue LED chip 36 covered with encapsulant 50 that does not contain wavelength-converting material to form a blue LED. Alternatively, the encapsulant covering the third blue LED 36 chip contains wavelength-converting material that allows a portion of the first blue light to be emitted. For example, the encapsulant contains green wavelength-converting material to boost the emissions of the LED device 30 in the green portion of the spectrum, while still allowing sufficient blue light to be emitted to obtain the desired combined spectral emission from the LED device 30 and allow color tuning. In a particular embodiment, the spectral emission from the LED device appears essentially white.

Figure 3D:
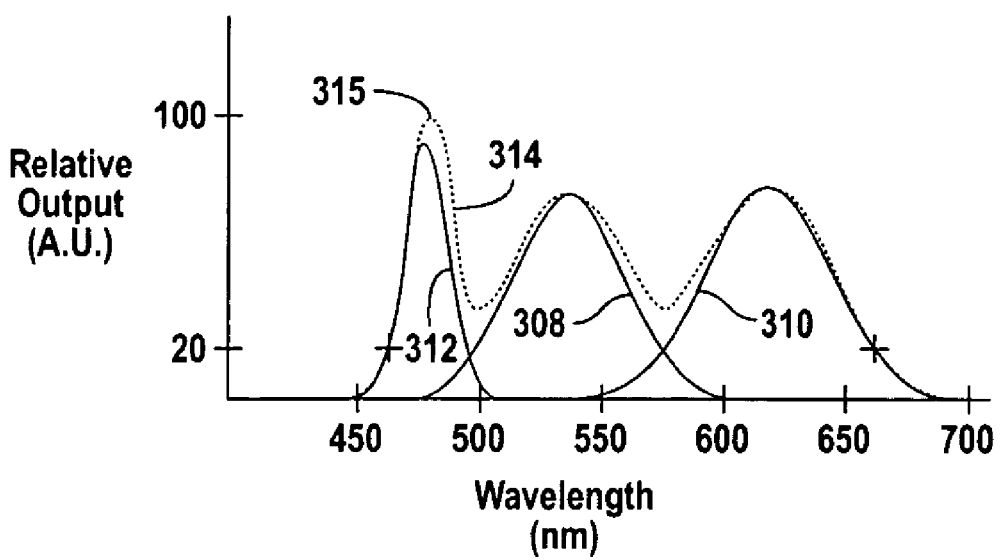
FIG. 3D shows plots of the emissions from an LED device according to an embodiment of the invention.

FIG. 3D shows plots of the emissions from an LED device in accordance with the preceding paragraph. The first plot 308 shows the green emission from the green wavelength-converting material covering a first blue LED chip. The second plot 310 shows the red emission from the red wavelength-converting material covering a second blue LED chip, and the third plot 312 shows the blue emission from a third blue LED chip without phosphor conversion. The wavelength-converting materials and LEDs are merely exemplary. A fourth plot 314 shows the combined total emission of the LEDs in the LED device. The combined total emission 314 has a peak combined total emission 315 and the combined total emission of the LED device is at least 20% of the peak combined total emission from about 460 nm to about 660 nm. A combined total emission having a broad emission (i.e., one that does not dip below 20% of peak emission) from about 460 nm to about 660 nm is desirable for producing high-quality white light. In an alternative embodiment, the current (bias) provided to the blue LED (plot 312) is reduced to reduce the peak combined total emission, resulting in an even flatter combined total emission and lower color temperature. In yet another embodiment, the current provided to the blue LED is increased to produce a higher color temperature.

A wide variety of LED chips and wavelength-converting materials are used in alternative embodiments. In some embodiments, LED chips having different peak wavelengths are used. The peak wavelength of an LED chip is chosen in some embodiments to efficiently stimulate a wavelength-converting material used in conjunction with that LED chip. In alternative or further embodiments, the peak wavelength of an LED chip is chosen to provide first radiation in a desired portion of the spectrum when lightly loaded.

Figure 4A:
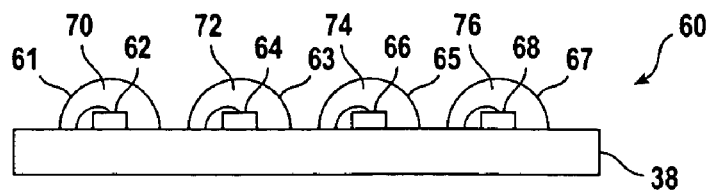
FIG. 4A is a side view of an LED device according to another embodiment of the invention.

FIG. 4A is a side view of an LED device 60 according to another embodiment of the invention. Four blue-emitting LED chips 62, 64, 66, 68 are mounted on, and electrically connected to, a substrate 38. A first LED 61 includes a first blue-emitting LED chip 62 covered with an encapsulant 70 that does not contain a wavelength-converting material. A second LED 63 includes a second blue-emitting LED chip 64 covered with an encapsulant 72 containing green wavelength-converting material and emits only a second green radiation. A third LED 65 includes a third blue-emitting LED chip 66 covered with an encapsulant 74 containing red wavelength-converting material and emits only a second red radiation. A fourth LED 67 includes a fourth LED chip 68 covered with an encapsulant 76 containing yellow wavelength-converting material, such as cerium-doped yttrium-aluminum garnet (YAG:Ce), and emits only a second yellow radiation.

Figure 4B:
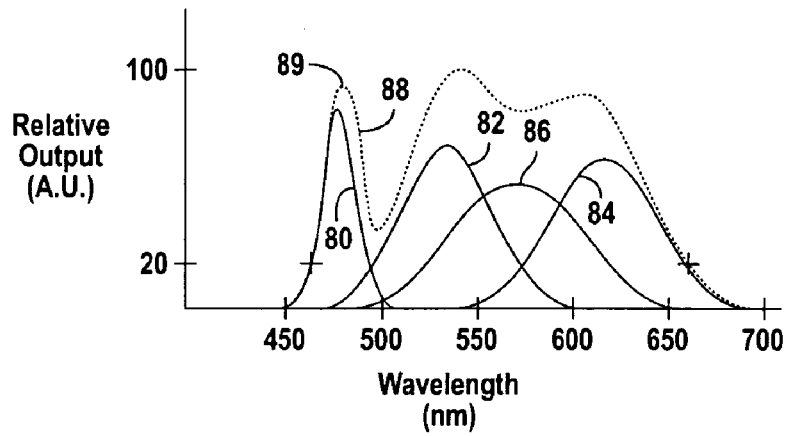
FIG. 4B shows plots of the emissions from the LED device shown in FIG. 4A.

FIG. 4B shows plots of the emissions from the LED device shown in FIG. 4A. A first plot 80 is the first blue radiation from the first LED. A second plot 82 is the second green radiation of the second LED. A third plot 84 is the second red radiation of the third LED, and a fourth plot 86 is the second yellow radiation of the fourth LED. A fifth plot 88 shows the combined total emission of the LED device. A broad spectral emission is obtained with a peak in the blue region, and a high plateau in the green and yellow regions, dropping off in the red region. By combining the emissions of red, yellow, green, and blue light in the appropriate proportions, light that appears substantially white is obtained.

The combined total emission 88 has a peak combined total emission 89 and the combined total emission of the LED device is at least 20% of the peak combined total emission from about 465 nm to about 675 nm. A combined total emission having a broad emission (i.e. one that does not dip below 20% of peak emission) from about 465 nm to about 675 nm is desirable for producing high-quality white light.

Figure 5A:
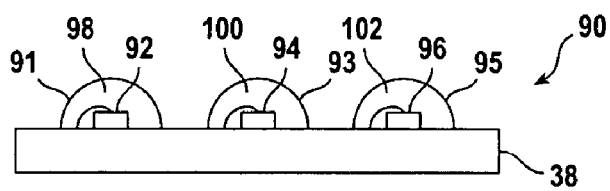
FIG. 5A is a side view of an LED device having three UV LEDs mounted on and electrically connected to a substrate, according to another embodiment of the invention.

FIG. 5A is a side view of an LED device 90 having three UV LED chips 92, 94, 96 mounted on and electrically connected to a substrate 38, according to another embodiment of the invention. Each of the UV LED chips emits light in the ultraviolet region of the spectrum, which is generally light having a wavelength less than about 400 nm. A first LED 91 includes a first UV LED chip 92 covered with an encapsulant 98 containing a blue wavelength-converting material, and emits only second blue radiation. A second LED 93 includes a second UV LED chip 94 covered with an encapsulant 100 containing a green wavelength-converting material, and emits only a second green radiation. A third LED 95 includes a third UV LED chip 96 is covered with an encapsulant 102 containing a red wavelength-converting material, and emits only second red radiation. By selecting the amount of red, blue, and green light produced by the individual LEDs 91, 93, 95, typically by adjusting the bias to the each LED, light that appears substantially white is obtained from the LED device 90.

Examples of red-emitting phosphors that are excited by blue light include: $CaS:Eu^{2+}$, $Mn^{2+}$(650 nm); $SrS:Eu^{2+}$(610 nm); $(Zn,Cd)S:Ag^+$(600 nm); $Mg_4GeO_{5.5}$: $Mn^{4+}$(650 nm); and ZnSe:Cu, Cl (620-630). An example of an orange-emitting phosphor excited by blue light is ZnSeS:Cu,Cl (590-600 nm). An example of a green-yellow emitting phosphor excited by blue light is $CaS:Ce^{3+}$(520-580 nm). Examples of green-emitting phosphors excited by blue light include $ZnS:Cu^+$(550 nm); $SrGa_2S_4:Eu^{2+}$(535 nm); yttrium-aluminum-garnet ("YAG"):$Ce^{3+}$(550 nm); and $BaSrGa_4S_7$:Eu (540 nm). An example of a blue-emitting phosphor excited by UV light (about 365-420 nm) is $BaAl_{16}Mg_2O_{27}$ ("BAM") (450 nm). An example of a green-emitting phosphor excited by UV light is ZnS:Cu,Al (540 nm). Examples of red-emitting phosphors excited by UV light include $Y_2O_2S$:Eu (628 nm) and $Mg_4GeO_{5.5}$F:Mn (650 nm).

Figure 5B:
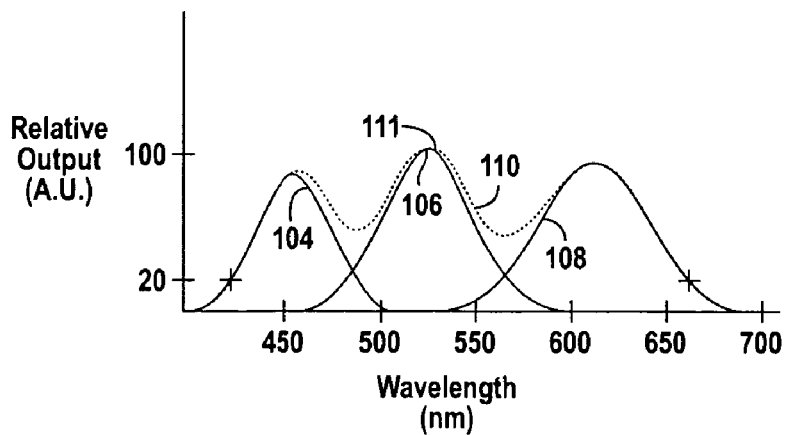
FIG. 5B shows plots of the emissions from the LED device shown in FIG. 5A.

FIG. 5B shows plots of the emissions from the LED device shown in FIG. 5A. A first plot 104 is the second blue radiation from the first LED. A second plot 106 is the second green radiation from the second LED. A third plot 108 is the second red radiation from the third LED. A fourth plot 110 is the combined emission of the LED device. The combined emission from this embodiment has a desirable broad peak in the green region of the spectrum, compared to the combined emissions illustrated in FIGS. 3D and 4B, resulting from the broad second blue emissions from the first LED combining with the broad second green emissions from the second LED. The combined total emission 110 has a peak combined total emission 111 and the combined total emission of the LED device is at least 20% of the peak combined total emission from about 423 nm to about 661 nm. The combined total emission does not dip below 20% of peak emission over a greater range than the embodiments illustrated in FIGS. 3D and 4B, for example, which use unconverted blue light from a blue-emitting LED chip. The blue emission is broadened significantly compared to the first (unconverted) blue light from a blue LED chip (compare FIG. 4B, plot 80). It is expected that this broader blue light will provide both better color rendering for blues and purples when used in a flash module, and also will enable higher color temperatures to be achieved.

An advantage of using UV LED chips in combination with wavelength-converting materials is that no first radiation contributes to the combined emission in the visual portion of the spectrum. Hence, the construction of the device is insensitive to loading of the wavelength-converting materials, thus simplifying the manufacturing process. It is generally desirably to convert all the UV light to obtain maximum efficiency, and also to avoid undesirably illuminating a subject with UV light.

Figure 6A:
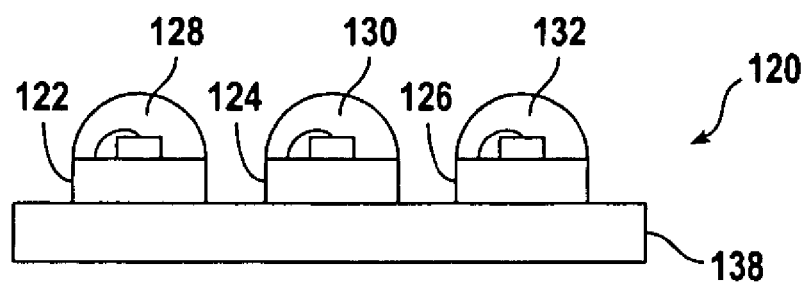
FIG. 6A is a side view of an LED device according to another embodiment of the invention.
Figure 6B:
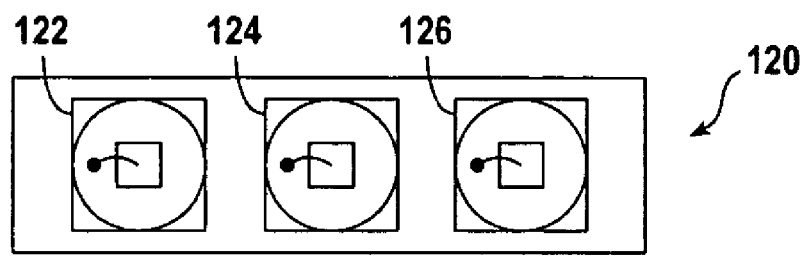
FIG. 6B is a plan view of the LED device of FIG. 6A.

FIG. 6A is a side view of an LED device 120 according to another embodiment of the invention. Three discrete UV LED devices 122, 124, 126 are attached to a substrate 138 using a solder reflow technique or similar assembly technique. The first UV LED device 122 includes encapsulant 128 with a blue wavelength-converting material and emits only blue second radiation. The second UV LED device 124 includes encapsulant 130 with a green wavelength-converting material and emits only green second radiation. The third UV LED device 126 includes encapsulant 132 with a red wavelength-converting material and emits only red second radiation. FIG. 6B is a plan view of the LED device 120 of FIG. 6A, showing the first UV LED device 122, the second UV LED device 124, and the third UV LED device 126.

Figure 7:
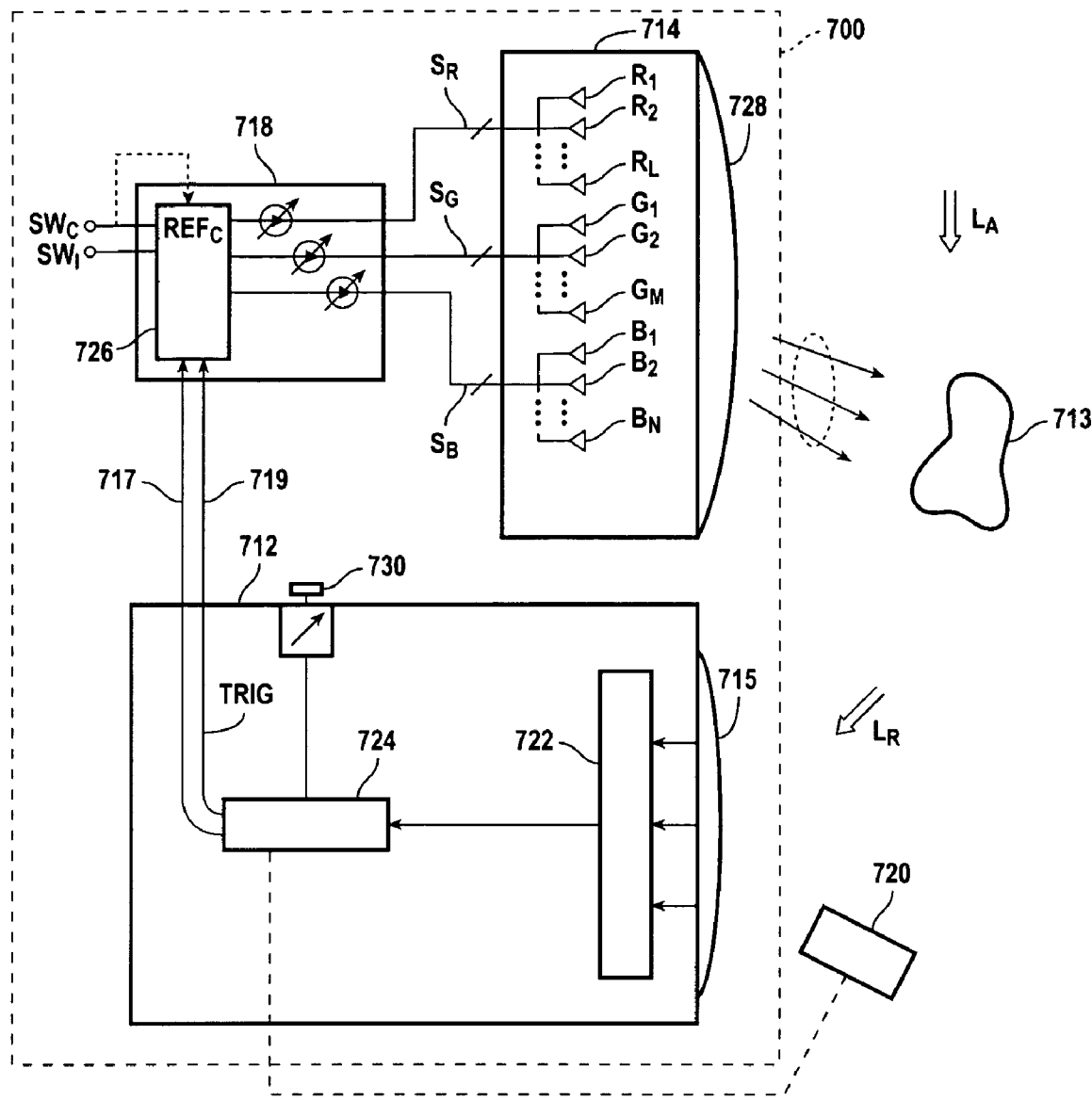
FIG. 7 shows a block diagram of a flash module according to an embodiment of the present invention.

FIG. 7 shows a block diagram of a flash module 714 according to an embodiment of the present invention. The flash module 714 is part of an imaging system 700 that also includes a camera 712. The flash module 714 includes one or more light-emitting devices of one or more selected colors, such as red-, green-, and/or blue-emitting LED devices. At least one colored light-emitting device has a FWHM greater than about 50 nm.

In one embodiment, the flash module 714 includes at least one each of a red or red-converted LED R1, R2, $R_N$, a blue or blue-converted LED B1, B2, $B_N$, and a green or green-converted LED G1, G2, $G_N$. In some embodiments, at least one of the colored LEDs includes a wavelength-converting phosphor overlay (see, e.g., FIG. 3A, ref. num. 48) emitting second radiation of a selected color. Alternatively, an additional LED, such as a blue LED or a UV LED includes a wavelength-converting phosphor overlay providing second radiation of a different selected color. An imaging element 728, such as a lenses and/or reflectors, is optionally included in the flash module 714 to control the spatial distribution of light from the flash module 714.

The camera 712 is a digital camera that includes an array of photodetectors 722. Ambient light $L_A$ is imaged onto the photodetector array from a lens 715. An electrical signal(s) from the photodetector array is coupled to a processor 724. The processor 724 is coupled through a link 717 to a driver 718 that provides individually selected current ("drive signals") $S_R$, $S_G$, $S_B$ to the associated light emitters. The driver is incorporated in the flash module 714, or alternatively is incorporated in the camera or an external module. The driver 718 includes a series of variable current sources controlled by a control circuit 726. The amount of light ("light output") of a LED depends on the current (i.e. drive signal level) supplied to it. Varying the drive signal of the corresponding light emitter enables selectively tuning the spectral distribution of light from the flash module 714 by selectively and independently varying the amount light output from the controllable colored light sources (colored LEDs). The processor 724 also provides a trigger signal over a trigger link to initiate a flash $L_F$ from the flash module 714 when the camera shutter is activated.

In one embodiment, the electrical signal(s) indicates the color temperature of the ambient light $L_A$ or light reflected $L_R$ from an object 713. Alternatively, the camera is a film-type camera and a separate photodetector 720 measures light from the object 713. The separate photodetector 720 is external to the camera, or alternatively is integrated with the camera. In an alternative or further embodiment, a manual adjustment 730 is provided to allow a user to set the flash module 714 to produce a desired color temperature or to adjust the color temperature otherwise established by the processor 724 according to the ambient light $L_A$ measured by photodetectors. For example, the user might want to decrease the color temperature measured by the photodetectors to impart a warmer tone to an image of the object 713. In yet other embodiments, an imaging system does not include a photodetector and the color temperature of the light module is manually set.

The current signal $S_R$ supplied to the red LED during discharge (flash) determines how much red light the red LED contributes to the total combined emissions. For example, if the red LED is turned on slightly, the color temperature of the total combined emission is higher than if the red LED is turned on strongly. In a particular embodiment, selectively adjusting the current to the red LED produces a color temperature from about 5,500 degrees Kelvin, which is desirable for use with daylight film, to about 3,200 degrees Kelvin, which is desirable for use with tungsten film.

Other color temperatures are achieved by providing other amounts of current to the red LED or the other LEDs. In other applications, the desired color temperature of the total combined emission of the light module is selected for a desirable photographic effect, such as making a model's complexion "warmer" by reducing the color temperature. Additional colors of LEDs are optionally added to further control the color temperature, and more particularly, the CRI, of the light module.

Figure 8A:
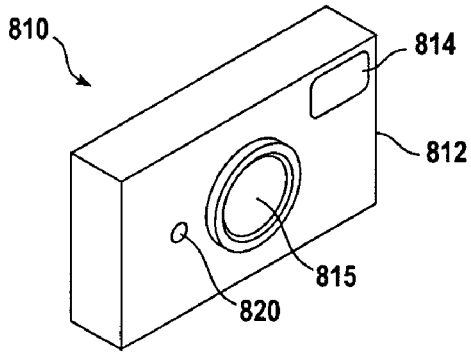
FIG. 8A is an isometric view of an imaging system according to an embodiment of the invention.
Figure 8B:
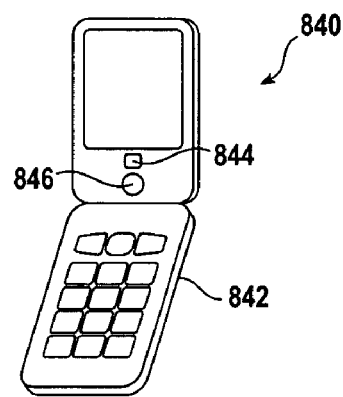
FIG. 8B is an isometric view of a mobile telephone according to another embodiment of the invention.

FIG. 8A is an isometric view of an imaging system 810 having a camera 812, lens 815, photodetector 820, and a flash module 814 according to an embodiment of the invention. Alternatively, the camera includes a photodetector array for imaging and the photodetector 820 is omitted. FIG. 8B is an isometric view of an imaging system 840 according to another embodiment of the invention integrated into a mobile telephone 842. The mobile telephone includes a flash module 844 having at least one colored light-emitting device having a FWHM greater than about 50 nm and an imaging lens 846. The imaging lens focuses an image of an object on a photodetector array (not shown) within the mobile telephone. The photodetector array is optionally used to measure a color temperature of the object or of the ambient light. The mobile telephone 842 optionally includes controls for manually setting the color temperature of the flash module 844.

Figure 9:
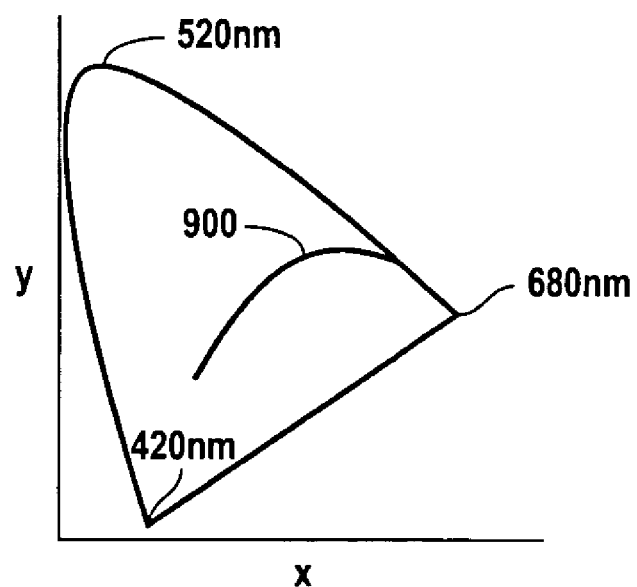
FIG. 9 is a plot of a black body curve on a chromaticity diagram.

FIG. 9 is a plot of a black body curve 900 on a chromaticity diagram. The chromaticity diagram is drawn according to the 1931 Commission International d'elchairge ("C.I.E.") standards, and is commonly known as a "C.I.E. 1931 Chromaticity Diagram" or "1931 C.I.E. Color Space." The x and y axes are color coordinates that specify points on the diagram. Color is also characterized by a luminance parameter. Representative wavelengths are provided for reference. The right corner represents light having a wavelength of 680 nm, which is essentially reddish light. The left corner represents light having a wavelength of 420 nm, which is essentially violet light, and the curve at 520 nm represents essentially greenish light. The color of the combined emission of a flash module or similar LED device having a plurality of adjacent LEDs is tuned by varying the relative amount of light from the differently colored LEDs. Tuning is accomplished by the amount of electrical power provided to an LED, or by the amount and type of wavelength-converting material over the LED, for example. The most desired color of the combined emission of a flash module depends on the type of photodetector array being used to image the subject. In many instances, a combined emission lying on or near the black body curve 900 is desirable.

In one embodiment, a light output power of the ratio 3:6:1 for red:green:blue light from an LED device having red, green and blue LEDs wherein at least two LEDs have a FWHM greater than 50 nm, such as illustrated in FIG. 3A or 5A, yields a combined emission close to the black body curve. The ratio refers to the output for each of the color diodes. For example, the green diode has a power output of six (arbitrary units), the red diode has a power output of 3 units and the blue diode has a power output of 1 unit.

The power output of each diode is individually selectable by increasing or decreasing the current supplied to the diode. For example, in the embodiment represented by FIGS. 3A and 3D, the currents to the blue diode (plot 312 in FIG. 3D) and red diode (plot 310 in FIG. 3D) are reduced relative to the green diode (plot 308 in FIG. 3D) to obtain the desired ratio of the peak emissions. Having at least one diode with a FWHM greater than 50 nm adjacent to other diodes in the LED device facilitates the tuning process (i.e. the process of selectively adjusting the current (bias) to each individual LED) because it can overlap the emission spectrum of one or more adjacent LEDs to produce a broad, gap-free combined total spectrum. Other techniques for color balancing include selectively loading the primary emitters (see, e.g. FIG. 3C), or by choosing alternative phosphor materials.

Light close to the black body curve is often expressed as color temperature in degrees, Kelvin. The color temperature is the color of light emitted by a black body at that temperature. For example, at lower temperatures, a block body glows a dull red, then orange, and then yellow, with increasing temperature. Daylight has a color temperature of about 6,500 degrees Kelvin, and this is a desirable color temperature for light from a flash module in many applications. It is sometimes desirable to have a higher or lower color temperature. For example, it might be desirable to provide "warmer" light, with a higher content of red light, when photographing a person's face. Note that such warmer light is at a lower color temperature. Similarly, it might be desirable to tune a flash output to match the film or sensor being used. Thus, it is desirable to provide flash modules producing essentially white light with a color temperature between about 5,000 degrees Kelvin and about 9,500 degrees Kelvin, and in a particular embodiment, to provide light having a color temperature of about 6,500 degrees Kelvin.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A light-emitting diode ("LED") device comprising:
a plurality of LEDs including
a first LED emitting at least a first color having a first full-width-half-maximum greater than 50 nm, the first LED comprising a first LED chip and a first encapsulant containing a first wavelength-converting material, the first LED chip being covered by the first encapsulant, the first LED chip of the first LED including a first blue-emitting LED chip, and
a second LED adjacent to the first LED emitting at least a second color, the second LED comprising a second LED chip and a second encapsulant containing a second wavelength-converting material, the second LED chip being covered by the second encapsulant, the second LED chip of the second LED including a second blue-emitting LED chip.

2. The LED device of claim 1 wherein the second color is a first radiation of the second LED.

3. The LED device of claim 1 wherein the second color has a second full-width-half-maximum greater than 50 nm.

4. The LED device of claim 1 wherein the first color is a second radiation of the first LED and the first LED further emits a third color that is a first radiation of the first LED.

5. The LED device of claim 4 wherein the first wavelength-converting material emits a green radiation.

6. The LED device of claim 1 having a peak combined total emission, wherein a combined total emission of the LED device is at least 20% of the peak combined total emission from 470 nm to 650 nm.

7. The LED device of claim 1 wherein the plurality of LEDs further includes a UV LED with a third wavelength-converting material.

8. The LED device of claim 1 wherein the first wavelength-converting material emits a green radiation and the second wavelength-converting material emits a red radiation.

9. The LED device of claim 8 wherein the plurality of LEDs further includes a blue LED emitting a blue radiation, and wherein the LED device has a power ratio of red:green:blue light of about 3:6:1.

10. The LED device of claim 7 wherein the first wavelength-converting material emits a green radiation, the second wavelength-converting material emits a red radiation, and the third wavelength-converting material emits a blue radiation.

11. The LED device of claim 10 wherein the LED device has a power ratio of red:green:blue light of about 3:6:1.

12. A light-emitting diode ("LED") device comprising:
a plurality of LEDs including
a first LED emitting at least a first color having a first full-width-half-maximum greater than 50 nm, the first LED comprising a first LED chip and a first encapsulant containing a first wavelength-converting material, the first LED chip being covered by the first encapsulant, the first LED chip of the first LED being a first ultraviolet ("UV") LED,
a second LED adjacent to the first LED emitting at least a second color, the second LED comprising a second LED chip and a second encapsulant containing a second wavelength-converting material, the second LED chip being covered by the second encapsulant, the second LED chip of the second LED being a second UV LED, and
a third UV LED with a third wavelength-converting material, wherein the first wavelength-converting material emits a blue radiation, the second wavelength-converting material emits a green radiation, and the third wavelength-converting material emits a red radiation.

13. The LED device of claim 12 wherein a combined emission of the LED device has a power ratio of red:green:blue light of about 3:6:1.

14. The LED device of claim 12 having a peak combined total emission, wherein a combined total emission of the LED device is at least 20% of the peak combined total emission from 450 nm to 650 nm.

15. The LED device of claim 1 emitting light having a color temperature of between 5,000 degrees Kelvin and 9,500 degrees Kelvin.

16. A flash module having an LED device in accordance with claim 1.

17. The flash module of claim 16 wherein a first bias is selectively applied to the first LED and a second bias is selectively applied to the second LED so as to produce a selected combined total emission from the flash module.

* * * * *